US012721001B2

(12) United States Patent
Kim et al.

(10) Patent No.: US 12,721,001 B2
(45) Date of Patent: Aug. 25, 2026

(54) DISPLAY DEVICE

(71) Applicant: LG Display Co., Ltd., Seoul (KR)

(72) Inventors: TaeWoo Kim, Paju-si (KR); Kyungjae Park, Incheon (KR); Hanul Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 394 days.

(21) Appl. No.: 18/470,067

(22) Filed: Sep. 19, 2023

(65) Prior Publication Data

US 2024/0224713 A1 Jul. 4, 2024

(30) Foreign Application Priority Data

Dec. 28, 2022 (KR) ........................ 10-2022-0188029

(51) Int. Cl.
*H10K 59/80* (2023.01)
*H10K 102/00* (2023.01)

(52) U.S. Cl.
CPC ....... *H10K 59/872* (2023.02); *H10K 59/8793* (2023.02); *H10K 2102/311* (2023.02)

(58) Field of Classification Search
CPC ............. H10K 59/872; H10K 59/8793; H10K 2102/311; H10K 59/80; H10K 59/12; H10K 59/40; H10K 50/84; H10K 50/86; H01L 23/60
USPC ........................................................... 257/40
See application file for complete search history.

(56) References Cited

U.S. PATENT DOCUMENTS 9,753,314 B2 9/2017 Kim et al.
9,759,857 B2 9/2017 Jun et al.
10,755,991 B2 8/2020 Park et al.
11,272,626 B2 3/2022 Lee et al.
12,133,451 B2 10/2024 Choi et al.
2005/0062693 A1 3/2005 Suzuki
2014/0146513 A1 5/2014 Choi et al.
2015/0286087 A1 10/2015 Kim et al.
2015/0338571 A1 11/2015 Jun et al.
2017/0139259 A1 5/2017 Kim et al.
2020/0051881 A1 2/2020 Park et al.
2021/0045258 A1 2/2021 Lee et al.
2021/0072849 A1 3/2021 Kim et al.
2021/0200018 A1 7/2021 Kim et al.
2022/0199922 A1* 6/2022 Choi ........................ B32B 27/40
2022/0209145 A1* 6/2022 Kim ......................... B32B 27/36
(Continued)

FOREIGN PATENT DOCUMENTS

CN 216902149 U 7/2022
CN 115132081 A 9/2022
(Continued)

OTHER PUBLICATIONS

Taiwan Intellectual Property Office, Office Action, Taiwanese Patent Application No. 112149027, Nov. 6, 2024, nine pages.

*Primary Examiner* — Tong-Ho Kim
(74) *Attorney, Agent, or Firm* — Fenwick & West LLP

(57) ABSTRACT

A display device includes a display panel that displays an image. The display device further includes a polarization member on the display panel. The display device further includes a back plate under the display panel. The display device further includes a metal plate under the back plate. The display device further includes an adhesive layer that attaches the back plate to the metal plate. An end of the metal plate is aligned with an end of the display panel.

19 Claims, 11 Drawing Sheets

(56) References Cited

U.S. PATENT DOCUMENTS

| | | | | |
|---|---|---|---|---|
| 2022/0382107 | A1 | 12/2022 | Huang et al. | |
| 2023/0109163 | A1* | 4/2023 | Kim | H10K 50/868 257/40 |

FOREIGN PATENT DOCUMENTS

| | | | |
|---|---|---|---|
| KR | 10-2006-0006151 | A | 1/2006 |
| KR | 10-2012-0017720 | A | 2/2012 |
| KR | 10-2014-0067626 | A | 6/2014 |
| KR | 10-2015-0115041 | A | 10/2015 |
| KR | 10-2015-0135817 | A | 12/2015 |
| KR | 10-2016-0129668 | A | 11/2016 |
| KR | 10-2019-0052475 | A | 5/2019 |
| KR | 10-2020-0019000 | A | 2/2020 |
| KR | 10-2021-0017058 | A | 2/2021 |
| KR | 10-2021-0086058 | A | 7/2021 |
| TW | 202226181 | A | 7/2022 |

* cited by examiner

DISPLAY DEVICE

CROSS-REFERENCE TO RELATED APPLICATION

This application claims the priority of Republic of Korea Patent Application No. 10-2022-0188029 filed on Dec. 28, 2022, in the Korean Intellectual Property Office, which is incorporated by reference in its entirety.

BACKGROUND

Field

The present disclosure relates to a display device, and more particularly, to a display device which may have uniformity in touch sensing sensitivity in an active area.

Description of the Related Art

Display devices used for a monitor of a computer, a television, or a cellular phone include an organic light emitting display device (OLED) and a liquid crystal display device (LCD). The OLED is a self-emitting device, and the LCD requires a separate light source.

Display devices have a wide range of diverse applications, including personal digital assistants, as well as monitors of computers and televisions. A display device with a large display area, and reduced volume and weight is being studied.

Recently, a flexible display device including a display panel manufactured by forming display elements and lines on a flexible substrate has been receiving attention as a next generation display device. The flexible substrate may be a substrate made of plastic which is a flexible material.

The flexible display device may be provided with a back plate and a metal plate on the back of the display panel to maintain a predetermined shape.

SUMMARY

An object to be achieved by the present disclosure is to provide a display device including a metal plate made of an amorphous metal.

Another object to be achieved by the present disclosure is to provide a display device including a metal plate made of an amorphous metal and a resin-based material.

Yet another object to be achieved by the present disclosure is to provide a display device capable of reducing the occurrence of cracks caused by an impact applied to a side surface of the display device.

Still another object to be achieved by the present disclosure is to provide a display device in which charges caused by static electricity may be smoothly transferred to a metal plate.

Objects of the present disclosure are not limited to the above-mentioned objects, and other objects, which are not mentioned above, can be clearly understood by those skilled in the art from the following descriptions.

In one embodiment, a display device comprises: a display panel configured to display an image; a polarization member on the display panel; a back plate on the display panel such that the display panel is between the back plate and the polarization member; a metal plate on the back plate; and an adhesive layer between the back plate and the metal plate, the adhesive layer attaching the back plate to the metal plate, wherein an end of the metal plate is aligned with an end of the display panel. Therefore, it is possible to reduce the occurrence of cracks in the display panel caused by an impact or a vibration applied to a side surface of the display device.

In one embodiment, a display device comprises: a display panel configured to display an image; a polarization member on the display panel; a cover window on the polarization member; a back plate on the display panel such that the display panel is between the back plate and the polarization member; a metal plate on the back plate and is connected to ground, the metal plate having a size that is a same as a size of the display panel; an adhesive layer between the back plate and the metal plate, the adhesive layer attaching the back plate to the metal plate; and an electrical path connected to the polarization member and the metal plate, the electrical path extending from a side surface of the polarization member to a side surface of the metal plate. Therefore, even when electrostatic charges are generated due to friction of the cover window, the charges may be transferred to the metal plate through the electrical path without affecting the display panel. Accordingly, it is possible to suppress a malfunction of the display panel.

In one embodiment, a display device comprises: a display panel configured to display an image; a metal plate on the display panel, the metal plate is connected to ground and has a first end that is aligned with a first end of the display panel; and a first conductive element connected to the display panel and the metal plate, the first conductive element extending from a side surface of the first end of the display panel to a side surface of the first end of the metal plate.

Other detailed matters of the exemplary embodiments are included in the detailed description and the drawings.

According to the present disclosure, a laser trimming process is performed by using a metal plate made of an amorphous metal. Thus, it is possible to fabricate the metal plate having the same size as a display panel.

According to the present disclosure, the display panel has the same size as the metal plate. Thus, it is possible to reduce the occurrence of cracks in the display panel caused by an external impact or vibration.

According to the present disclosure, a conductive film is disposed from a side surface of a polarization member to a side surface of the metal plate to form an electrical path. Thus, it is possible to suppress an effect of electrostatic charges generated due to friction of a cover window on the display panel and thus possible to improve the reliability of a display device.

According to the present disclosure, a resin-based layer having a modulus of 2 GPa or more is disposed in a trimming line overlapping region of the metal plate made of an amorphous metal. Thus, it is possible to reduce a laser trimming process time and enhance the rigidity of the metal plate.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
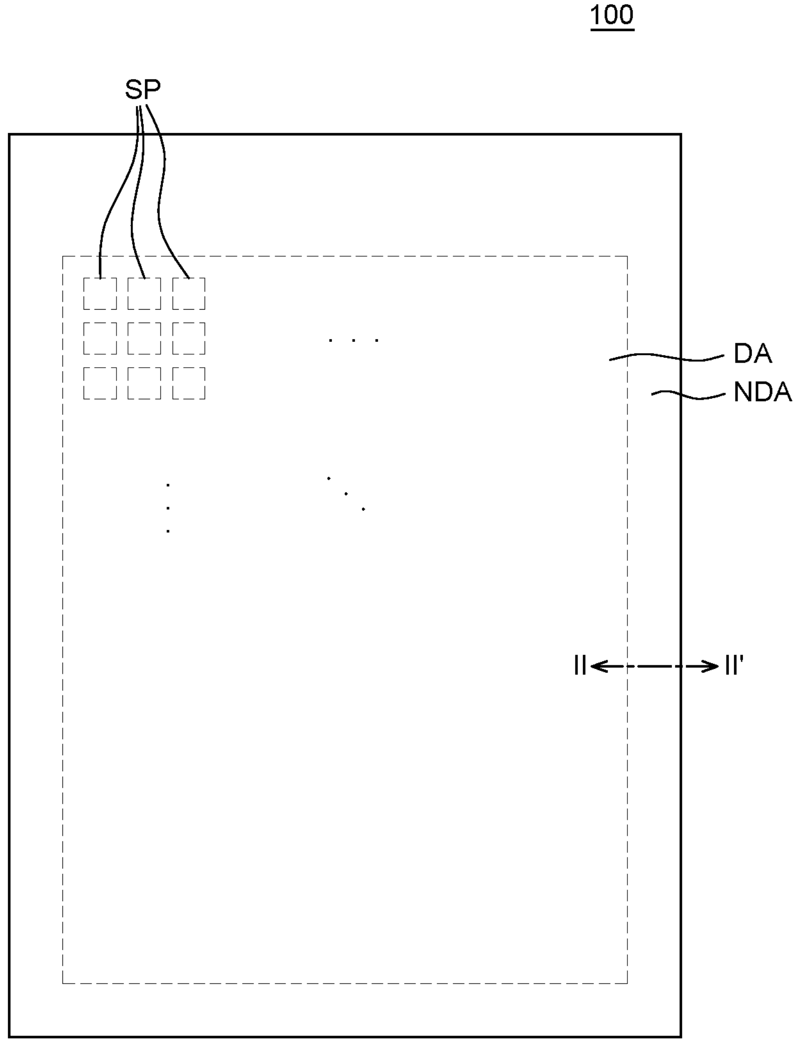
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

FIG. 1 is a plan view of a display device according to an exemplary embodiment of the present disclosure.

Referring to FIG. 1, a display device 100 according to an exemplary embodiment of the present disclosure includes a display area DA and a non-display area NDA.

The display area DA is an area where a plurality of pixels are disposed to display an image. In the display area DA, a pixel including an emission area for displaying an image and a driving circuit for driving the pixel may be disposed.

The plurality of pixels are disposed in a matrix form, and each of the plurality of pixels includes a plurality of sub-pixels SP. The plurality of sub-pixels SP may include a first sub-pixel, a second sub-pixel, and a third sub-pixel. The first sub-pixel, the second sub-pixel, and the third sub-pixel may be alternately and repeatedly disposed in a first direction (X-axis direction). For example, the first sub-pixel may be a red sub-pixel, the second sub-pixel may be a green sub-pixel, and the third sub-pixel may be a blue sub-pixel. Although it is described in the present disclosure that each of the plurality of pixels includes three sub-pixels, this is merely an example. The present disclosure is not limited thereto. A detailed structure of each sub-pixel will be described with reference to FIG. 3.

The non-display area NDA encloses the display area DA. The non-display area NDA is an area where an image is not displayed and various lines, a driving integrated circuit (IC), and a printed circuit board are disposed to drive the pixel and the driving circuit disposed in the display area DA. For example, various ICs, such as a gate driver IC and a data driver IC, and VSS lines may be disposed in the non-display area NDA.

Figure 2:
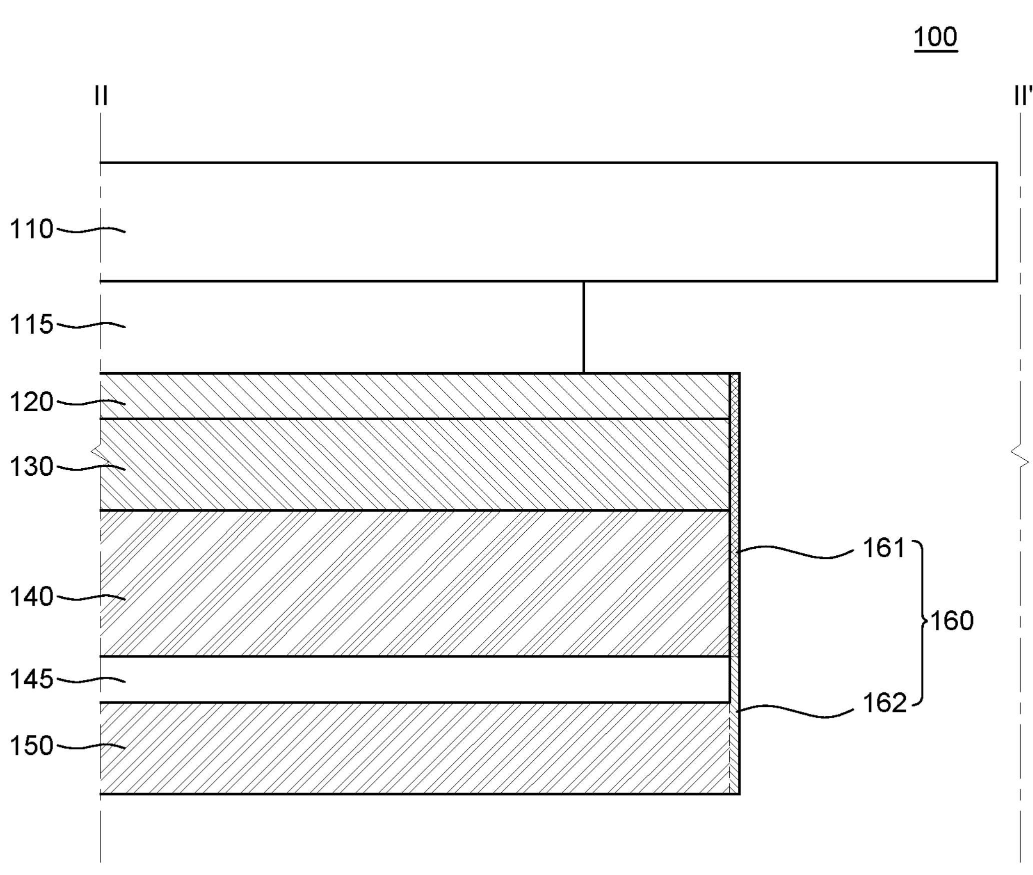
FIG. 2 is a schematic cross-sectional view as taken along a line II-II' of FIG. 1 according to an exemplary embodiment of the present disclosure.
Figure 3:
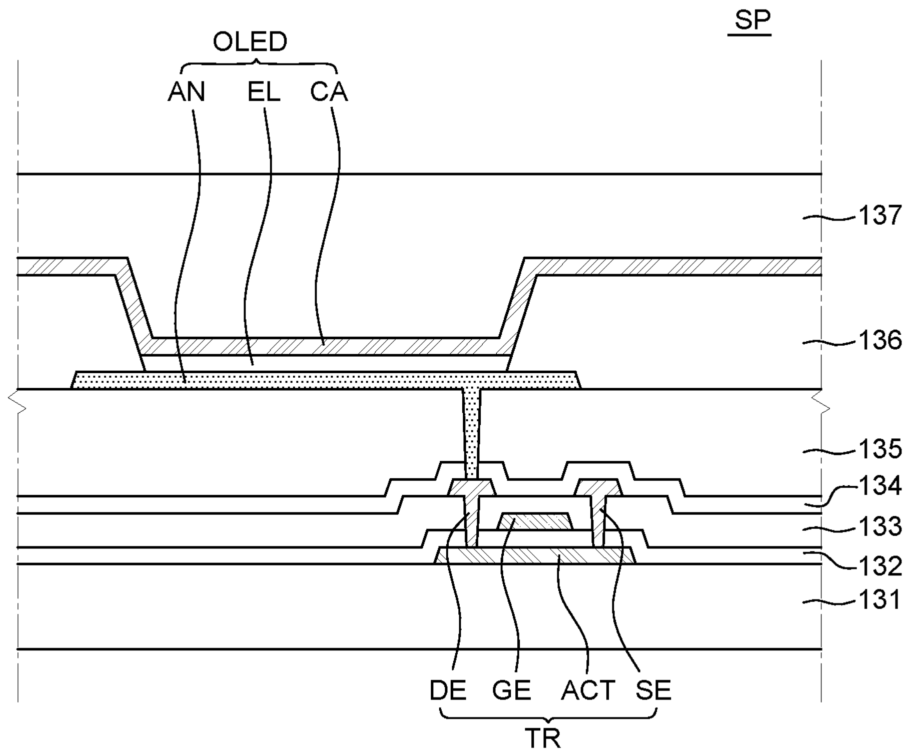
FIG. 3 is a schematic cross-sectional view of a sub-pixel of the display device according to an exemplary embodiment of the present disclosure.

FIG. 2 is a schematic cross-sectional view as taken along a line II-II' of FIG. 1 according to an exemplary embodiment of the present disclosure. FIG. 3 is a schematic cross-sectional view of a sub-pixel of the display device according to an exemplary embodiment of the present disclosure. FIG. 3 illustrates the structure of the display area DA shown in FIG. 1. However, a display panel 130 will be mainly described, and illustration of a cover window 110, a first adhesive layer 115, a polarization member 120, a back plate 140, a second adhesive layer 145, and a metal plate 150 is omitted.

Referring to FIG. 2, the display device 100 according to an exemplary embodiment of the present disclosure may include the cover window 110, the first adhesive layer 115, and the polarization member 120. Also, the display device 100 may include the display panel 130, the back plate 140, the second adhesive layer 145, the metal plate 150, and a conductive film 160.

The cover window 110 is configured to cover the display area DA and the non-display area NDA of the display device 100, and may be disposed on an upper surface of the display device 100. That is, the cover window 110 may form an outer surface of the display device 100. More specifically, the cover window 110 may have a polygonal shape including a rectangular shape, or a circular shape. The cover window 110 may be made of a transparent material, for example, glass or a tempered glass material.

The cover window 110 may include a transparent area and an opaque area. The transparent area may correspond to the display area DA, and the opaque area may correspond to the non-display area NDA. Although not shown in FIG. 2, a black matrix (BM) layer is disposed in the opaque area. The BM layer serves to cover various driving ICs and lines disposed in the non-display area NDA and may be made of a light blocking material.

The first adhesive layer 115 may attach the cover window 110 to the polarization member 120. The first adhesive layer 115 may be an optical adhesive film and may be, for example, an optically clear adhesive (OCA) or a pressure sensitive adhesive (PSA).

The polarization member 120 is disposed on a lower surface of the cover window 110. The polarization member 120 serves to selectively transmit light. Specifically, the polarization member 120 may suppress reflection of external light incident onto the display panel 130. More specifically, various metal materials used for semiconductor elements, lines, light emitting diodes, etc. are disposed in the display panel 130. Thus, external light incident onto the display panel 130 may be reflected by the metal materials in the display panel 130. Also, reflection of external light may cause degradation of visibility and contrast ratio of the display panel 130. Therefore, in the display device 100, the polarization member 120 configured to suppress reflection of external light is disposed on the display panel 130 in order to enhance the visibility of the display panel 130. A main material of the polarization member 120 may be carbon. In the present disclosure, the main material refers to a material accounting for the largest portion among various materials of the member, and may be, for example, a material having the highest weight ratio.

The display panel 130 is disposed on a lower surface of the polarization member 120. The display panel 130 may include the display area DA where a plurality of pixels are disposed to display an image. Also, the display panel 130 may include the non-display area NDA where lines and driving circuit ICs for driving the plurality of pixels are disposed. The display panel 130 may be a flexible display panel.

Referring to FIG. 3, each sub-pixel SP in the display panel 130 may include a substrate 131, a thin film transistor TR, a gate insulating layer 132, an insulating layer 133, and a passivation layer 134. Also, each sub-pixel SP in the display panel 130 may include a planarization layer 135, a light emitting diode OLED (e.g., a light emitting element), a bank 136, and an encapsulation layer 137.

The substrate 131 serves to support and protect components of the display panel 130. The substrate 131 may be made of a flexible material, for example, polyimide. Thus, the display panel 130 may be a flexible display panel. Although not shown in the drawings, a buffer layer may be disposed on the substrate 131 to suppress permeation of external moisture or other impurities. However, the buffer layer is not an essential component, and may be omitted depending on the type of the substrate 131 or the type of the thin film transistor TR disposed on the substrate 131. Although not shown in FIG. 3, the back plate 140, the second adhesive layer 145, and the metal plate 150 may be sequentially disposed under the substrate 131.

The thin film transistor TR is disposed on the substrate 131. The thin film transistor TR includes a gate electrode GE, an active layer ACT, a source electrode SE, and a drain electrode DE.

The active layer ACT may include a source region and a drain region which contain p-type or n-type impurities, and a channel region between the source region and the drain region. The active layer ACT may be made of a semiconductor material such as an oxide semiconductor, amorphous silicon or polycrystalline silicon.

The gate insulating layer 132 is disposed on the active layer ACT. The gate insulating layer 132 serves to insulate the active layer ACT from the gate electrode GE. The gate insulating layer 132 may be made of an inorganic insulating material. For example, the gate insulating layer 132 may be formed as a single layer or a multilayer of silicon oxide (SiOx) or silicon nitride (SiNx), but is not limited thereto.

The gate electrode GE serves as a switch to turn on or off the thin film transistor TR based on an electric signal transmitted from the outside through a gate line (not shown) disposed in the display area DA. The gate electrode GE may be made of a conductive metal. For example, the gate electrode GE may be formed as a single layer or a multilayer of copper (Cu), aluminum (Al), molybdenum (Mo), chromium (Cr), gold (Au), titanium (Ti), nickel (Ni), neodymium (Nd) or an alloy thereof. However, the present disclosure is not limited thereto.

The insulating layer 133 is disposed on the gate electrode GE. The insulating layer 133 serves to insulate the gate electrode GE from the source electrode SE and the drain electrode DE. The insulating layer 133 may be made of an inorganic insulating material. For example, the insulating layer 133 may be formed as a single layer or a multilayer of silicon oxide (SiOx) or silicon nitride (SiNx), but is not limited thereto.

The source electrode SE and the drain electrode DE are spaced apart from each other on the insulating layer 133. The source electrode SE and the drain electrode DE are connected to a data line (not shown) disposed in the display area DA. Also, the source electrode SE and the drain electrode DE allow an electric signal transmitted from the outside to be transmitted to the light emitting diode OLED through the thin film transistor TR. The source electrode SE and the drain electrode DE may be electrically connected to the active layer ACT through contact holes formed in the gate insulating layer 132 and the insulating layer 133. Further, the drain electrode DE may be electrically connected to the light emitting diode OLED through a contact hole formed in the passivation layer 134 and the planarization layer 135. The source electrode SE and the drain electrode DE may be made of a conductive metal. For example, the source electrode SE and the drain electrode DE may be formed as a single layer or a multilayer of copper (Cu), aluminum (Al), molybdenum (Mo), chromium (Cr), gold (Au), titanium (Ti), nickel (Ni), neodymium (Nd) or an alloy thereof. However, the present disclosure is not limited thereto.

The passivation layer 134 is disposed on the thin film transistor TR configured as described above. The passivation layer 134 may serve to suppress unnecessary electrical connection between components of the thin film transistor TR and suppress contamination or damage from the outside. The passivation layer 134 may be made of an inorganic insulating material. For example, the passivation layer 134 may be formed as a single layer or a multilayer of silicon oxide (SiOx) or silicon nitride (SiNx). Although it is described in the present disclosure that the thin film transistor TR has a coplanar structure, the present disclosure is not limited thereto.

The planarization layer 135 is disposed on the passivation layer 134. The planarization layer 135 may serve to protect the thin film transistor TR and relieve a step generated due to the thin film transistor TR. Also, the planarization layer 135 may serve to reduce a parasitic capacitance generated among the thin film transistor TR, the gate line, the data line, and the light emitting diode OLED. The planarization layer 135 may be made of an organic insulating material. For example, the planarization layer 135 may be made of one or more materials of acrylic resin, epoxy resin, phenolic resin, polyamides resin, polyimides resin, unsaturated polyesters resin, polyphenylene resin, and benzocyclobutene. However, the present disclosure is not limited thereto.

The light emitting diode OLED is disposed on the planarization layer 135. The light emitting diode OLED includes an anode AN, an emission layer EL, and a cathode CA.

The anode AN supplies holes to the emission layer EL and may be made of a conductive material having a high work function. The anode AN may be made of a transparent conductive material such as indium tin oxide (ITO), indium zinc oxide (IZO), etc., but is not limited thereto. The anode AN may be electrically connected to the drain electrode DE through the contact hole formed in the passivation layer 134 and the planarization layer 135.

The emission layer EL is disposed on the anode AN. The emission layer EL serves to emit light. The emission layer EL may be composed of a single emission layer, or may have a structure in which a plurality of emission layers emitting light of different colors is laminated. The emission layer EL may further include organic layers such as a hole injection layer, a hole transport layer, an electron transport layer, and an electron injection layer.

The cathode CA is disposed on the emission layer EL. The cathode CA supplies electrons to the emission layer EL and may be made of a conductive material having a low work function. The cathode CA may be formed as a single layer across the plurality of sub-pixels SP. That is, the respective cathodes CA of the plurality of sub-pixels SP may be connected to each other and integrally formed. The cathode CA may be made of a transparent conductive material such as indium tin oxide (ITO) and indium zinc oxide (IZO) or an ytterbium (Yb) alloy, and may further include a metal doping layer, but is not limited thereto.

The bank 136 is disposed on the planarization layer 135 and the anode AN. The bank 136 may define an area where light is emitted. The bank 136 may be made of an organic insulating material. For example, the bank 136 may be made of one of polyimide, photo acryl, and benzocyclobutene, but is not limited thereto.

The encapsulation layer 137 is disposed on the light emitting diode OLED and the bank 136. The encapsulation layer 137 may serve to suppress oxidation or damage of the thin film transistor TR and the light emitting diode OLED caused by moisture, oxygen, or impurities introduced from the outside. The encapsulation layer 137 may be formed by alternately laminating a plurality of inorganic layers and one or more organic layers. Although not shown in FIG. 3, the polarization member 120, the first adhesive layer 115, and the cover window 110 may be disposed on the encapsulation layer 137.

The back plate 140 is disposed on a lower surface of the display panel 130 configured as described above. The back plate 140 serves to support the display panel 130. More specifically, since the display panel 130 is formed as a flexible display panel, the back plate 140 may be configured to maintain the shape and mechanical rigidity of the display panel 130. The back plate 140 may be made of, for example, a translucent plastic material.

The second adhesive layer 145 may attach the back plate 140 to the metal plate 150. The second adhesive layer 145 is between the back plate 140 and the metal plate 150 to attach together the back plate 140 and the metal plate 150. The second adhesive layer 145 may be an optical adhesive film and may be, for example, an optically clear adhesive (OCA) or a pressure sensitive adhesive (PSA).

The metal plate 150 is disposed on a lower surface of the back plate 140. The metal plate 150 may protect the display panel 130 from the other components of the display device 100 and block electrical interference from the other components. The metal plate 150 may be grounded to block electrical interference from the other components. That is, the metal plate 150 is connected to ground.

The metal plate 150 may have the same size as the display panel 130. That is, a tip end of the metal plate 150 may be matched with a tip end of the display panel 130. In other words, an end of the metal plate 150 is aligned with an end of the display panel 130.

In a general display device, a polarization member, a display panel, and a back plate are trimmed to a desired shape and then, a cover window is attached thereto with a first adhesive. Subsequently, a metal plate is further attached thereto with a second adhesive. When the metal plate is attached, the metal plate having a smaller size than the display panel is used in consideration of an attachment tolerance. This is to suppress protrusion of the metal plate to the outside. As such, in the general display device, the metal plate has a smaller size than the display panel. Thus, when a vibration or an impact is applied to a side surface of the display panel, the metal plate cannot protect the side surface of the display panel from the other components of the display device. Therefore, damage, such as cracks, may occur in the display panel.

However, in the display device 100 according to an exemplary embodiment of the present disclosure, the display panel 130 has the same size as the metal plate 150. Thus, even when an external impact or vibration is applied to a side surface of the display panel 130, the metal plate 150 may sufficiently protect the side surface of the display panel 130. Therefore, it is possible to minimize or at least reduce damage to the display panel 130.

The metal plate 150 may have a smaller thickness than the prior art to facilitate a trimming process and reduce a laser processing time. For example, the metal plate 150 may have a thickness of 50 μm to 100 μm.

The metal plate 150 may be made of an opaque amorphous metal. The amorphous metal of the metal plate 150 may include, for example, a nickel (Ni)-based alloy or a copper (Cu)-based alloy. The metal plate 150 is made of the amorphous metal because a trimming process is performed after the display panel 130 is attached to the metal plate 150 in order for the metal plate 150 to have the same size as the display panel 130. That is, the metal plate 150 needs to be made of a material that reduces a trimming process time and facilitates a trimming process. The process of fabricating the display device 100 will be described in more detail with reference to FIG. 5A through FIG. 5C.

The conductive film 160 (e.g., a conductive element) may be formed from a side surface of the polarization member 120 to a side surface of the metal plate 150. That is, the conductive film 160 is on a side surface of the polarization member 120, a side surface of the display panel 130, a side surface of the backplate 140, a side surface of the second adhesive layer 145, and a side surface of the metal plate 150. In one embodiment, conductive film 160 is in direct contact with at least one of the side surface of the polarization member 120, the side surface of the display panel 130, the side surface of the backplate 140, the side surface of the second adhesive layer 145, and the side surface of the metal plate 150 as shown in FIG. 2. The conductive film 160 may be formed of ash that is generated and flows downward when the polarization member 120 and the metal plate 150 are melted and charred by heat during a trimming process with a ultra violet (UV) laser. That is, the conductive film 160 may be a layer configured to adsorb materials of the polarization member 120 and the metal plate 150. Thus, a first end of the conductive film 160 may be connected to the polarization member 120, and a second end of the conductive film 160 may be connected to the metal plate 150.

The conductive film 160 may serve as a ground path that is an electrical path through which charges generated when a pen or a finger touches the cover window 110 are transferred to the metal plate 150. The conductive film 160 may include a first conductive film 161 and a second conductive film 162 in one embodiment.

The first conductive film 161 may be disposed on respective side surfaces of the polarization member 120, the display panel 130, and the back plate 140. The first conductive film 161 may be connected to the polarization member 120. As shown in FIG. 2, the first conductive film 161 is on the side surface of the end of the display panel 130 but is not on the side surface of the end of the metal plate 150. A main material of the first conductive film 161 may be carbon in one embodiment. More specifically, the first conductive film 161 is mainly made of carbon and may also contain oxygen.

The second conductive film 162 may be disposed on respective side surfaces of the second adhesive layer 145 and the metal plate 150. As shown in FIG. 2, the second conductive film 162 is on the side surface of the end of the metal plate 150 but is not on the side surface of the end of the display panel 130. The second conductive film 162 may be connected to the metal plate 150, and a main material of the second conductive film 162 may be nickel or copper. Thus, the first conductive film 161 and the second conductive film 162 are made of different materials. When the metal plate 150 is mainly made of a nickel-based amorphous alloy, the second conductive film 162 may also be mainly made of nickel. When the metal plate 150 is mainly made of a copper-based amorphous alloy, the second conductive film 162 may also be mainly made of copper. More specifically, the second conductive film 162 may be mainly made of one of nickel and copper, and carbon and oxygen may also be detected in addition to iron, chromium, silicon, etc. included in the nickel alloy or copper alloy. Meanwhile, it is described in the present disclosure that the first conductive film 161 is connected to the polarization member 120 and disposed from the side surface of the polarization member 120 to the side surface of the back plate 140. Also, it is described in the present disclosure that the second conductive film 162 is connected to the metal plate 150 and disposed from the side surface of the second adhesive layer 145 to the side surface of the metal plate 150. However, as described above, the conductive film 160 is formed by a trimming process with a laser and thus may not have a definite boundary. Thus, the arrangement area of the first conductive film 161 and the arrangement area of the second conductive film 162 may not be limited to thereto. For example, the first conductive film 161 may be connected to the polarization member 120. Also, the first conductive film 161 may be disposed from the side surface of the polarization member 120 to the side surface of the display panel 130, a partial side surface of the back plate 140, or a partial side surface of the second adhesive layer 145. The second conductive film 162 may be disposed from a partial side surface of the back plate 140 or a partial side surface of the second adhesive layer 145 to the side surface of the metal plate 150.

Figure 4:
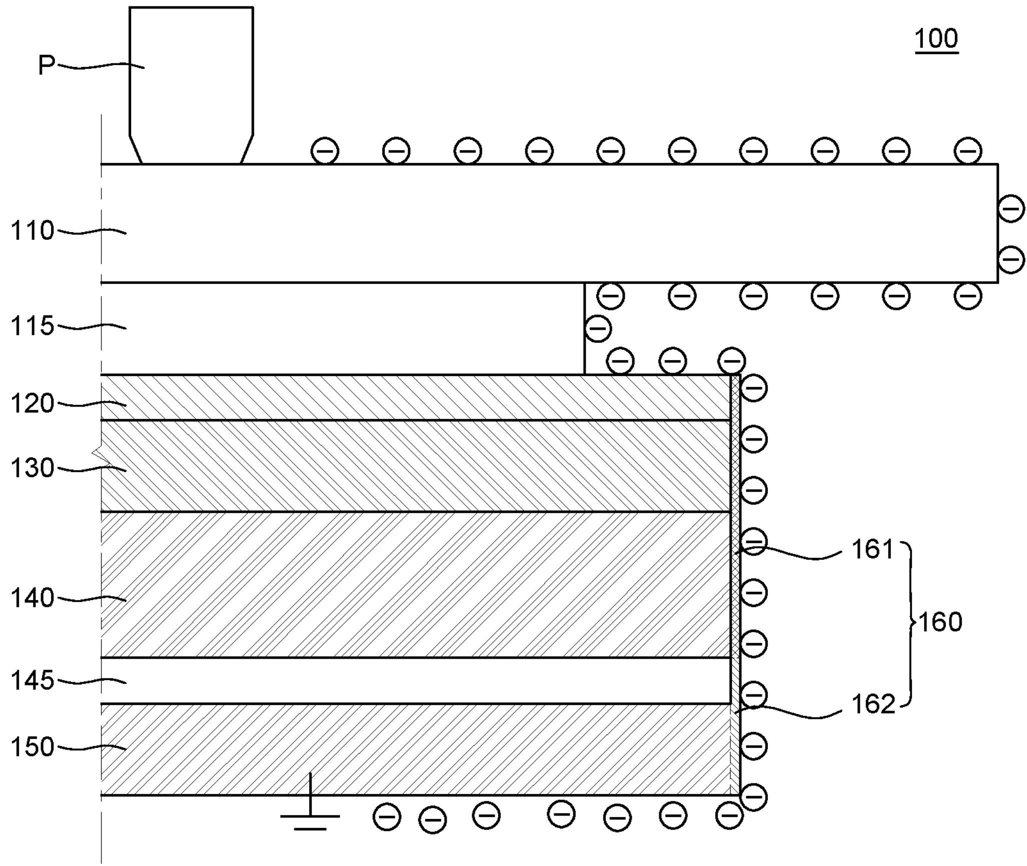
FIG. 4 is a cross-sectional view for explaining the transfer of charges in the display device according to an exemplary embodiment of the present disclosure.

FIG. 4 is a cross-sectional view for explaining the transfer of charges in the display device according to an exemplary embodiment of the present disclosure.

Referring to FIG. 4, in the display device 100, respective tip ends of the polarization member 120, the display panel 130, the back plate 140, the second adhesive layer 145, and the metal plate 150 are aligned with each other. The conductive film 160 may be disposed from the side surface of the polarization member 120 to the side surface of the metal plate 150.

Referring to FIG. 4, charges are generated due to static electricity when friction, such as a touch by a finger or a pen P, occurs on the cover window 110. The generated charges are transferred downwards. Since the conductive film 160 is continuously formed from the polarization member 120 to the metal plate 150, the generated charges may be smoothly transferred along the conductive film 160 to the grounded metal plate 150.

Meanwhile, as described above, in the general display device, a trimming process is performed after the display panel is attached to the back plate, and the metal plate has a smaller size than the display panel. Conventionally, a conductive film is formed from the polarization member to the back plate. Thus, charges generated due to friction of the cover window may be smoothly transferred only to the back plate. Even if the metal plate is grounded, the charges caused by static electricity cannot be discharged to the outside and may be introduced into the display panel and may affect electrodes, lines and driving circuits inside the display panel. Therefore, the reliability of the display device may be degraded.

However, in the display device 100 according to an exemplary embodiment of the present disclosure, even if charges are generated due to friction of the cover window 110, the charges may be smoothly transferred to the grounded metal plate 150 through the conductive film 160. Thus, it is possible to suppress damage to the display panel 130 and improve the reliability of the display device 100.

Figure 5A:
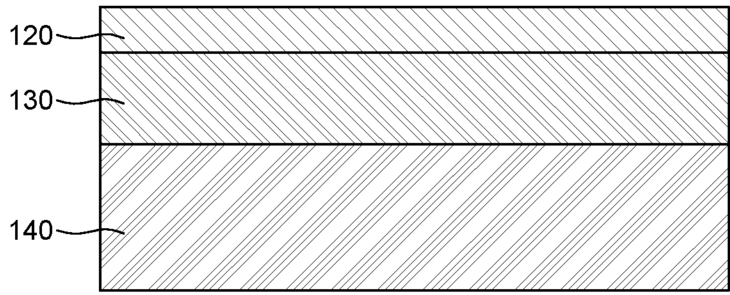
FIGS. 5A to 5C are cross-sectional views for explaining a process of fabricating the display device according to an exemplary embodiment of the present disclosure.
Figure 5B:
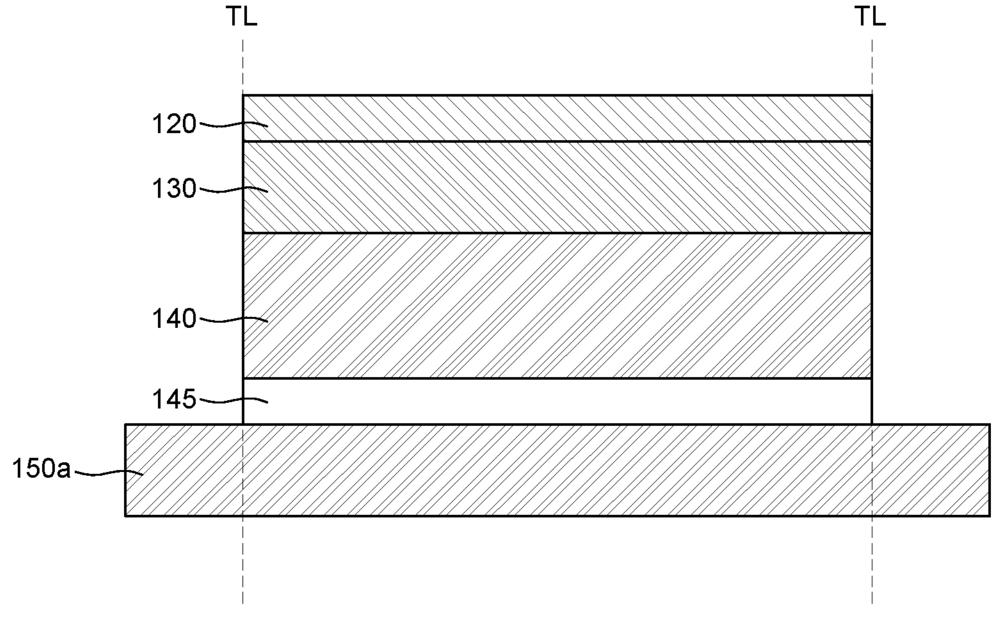
Figure 5C:
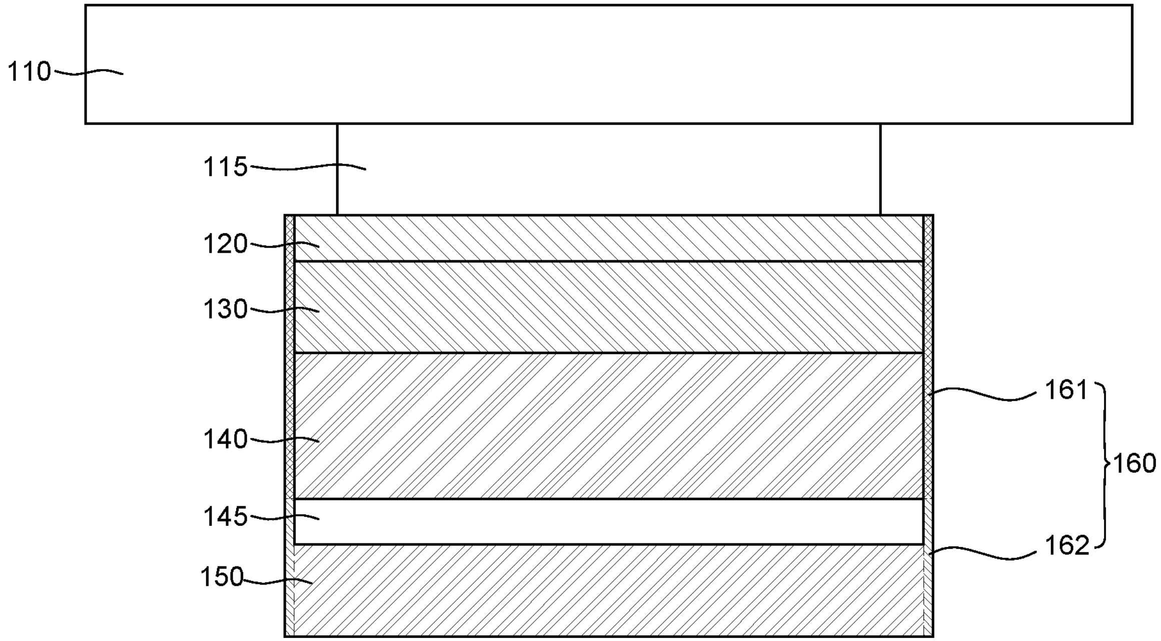

FIG. 5A through FIG. 5C are cross-sectional views for explaining a process of fabricating the display device according to an exemplary embodiment of the present disclosure.

Referring to FIG. 5A, the back plate 140, the display panel 130, and the polarization member 120 are sequentially laminated.

Then, referring to FIG. 5B, the laminated polarization member 120, display panel 130 and back plate 140 are attached to a basic metal plate **150*a* by using the second adhesive layer 145. Thereafter, a trimming process is performed on the polarization member 120, the display panel 130, the back plate 140, the second adhesive layer 145, and the basic metal plate 150*a* along a trimming line TL with a UV laser in order for the metal plate 150 and the display panel 130 to have the same size. The basic metal plate 150*a*** may be made of an amorphous metal.

Subsequently, referring to FIG. 5C, when the trimming process on the polarization member 120, the display panel 130, the back plate 140, the second adhesive layer 145, and the basic metal plate **150*a* is finished, the display panel 130 and the metal plate 150 may have the same size such that the ends of the display panel 130 and the metal plate 150 are aligned. That is, a first end of the display panel 130 is aligned with a first end of the metal plate 150 and a second end of the display panel 130 that is opposite the first end of the display panel 130 is aligned with a second end of the metal plate 150 that is opposite the first end of the metal plate 150. Thus, the conductive film 160 is formed from both side surfaces of the polarization member 120 to both side surfaces of the metal plate 150. For example, one conductive film 160 (e.g., the conductive element) extends from the first end of the display panel 130 to the first end of the metal plate 150 and the other conductive film 160 (e.g., the conductive element) extends from the second end of the display panel 130 to the second end of the metal plate 150 as shown in FIG. 5C. Then, when the cover window 110 is attached onto the polarization member 120 by using the first adhesive layer 115, the display device 100** according to an exemplary embodiment of the present disclosure is completed.

As described above, in the display device 100 according to an exemplary embodiment of the present disclosure, a trimming process is performed after the metal plate 150 is attached to a structure in which the polarization member 120, the display panel 130, and the back plate 140 are laminated. Thus, a tip end of the display panel 130 may be matched (e.g., aligned) with a tip end of the metal plate 150. Therefore, in the display device 100 according to an exemplary embodiment of the present disclosure, the conductive film 160 formed during the trimming process is disposed from the polarization member 120 to the metal plate 150. Thus, electrostatic charges generated due to friction on the cover window 110 may be transferred to the grounded metal plate 150. Accordingly, it is possible to suppress damage to the display panel 130 caused by the electrostatic charges.

Figure 6:
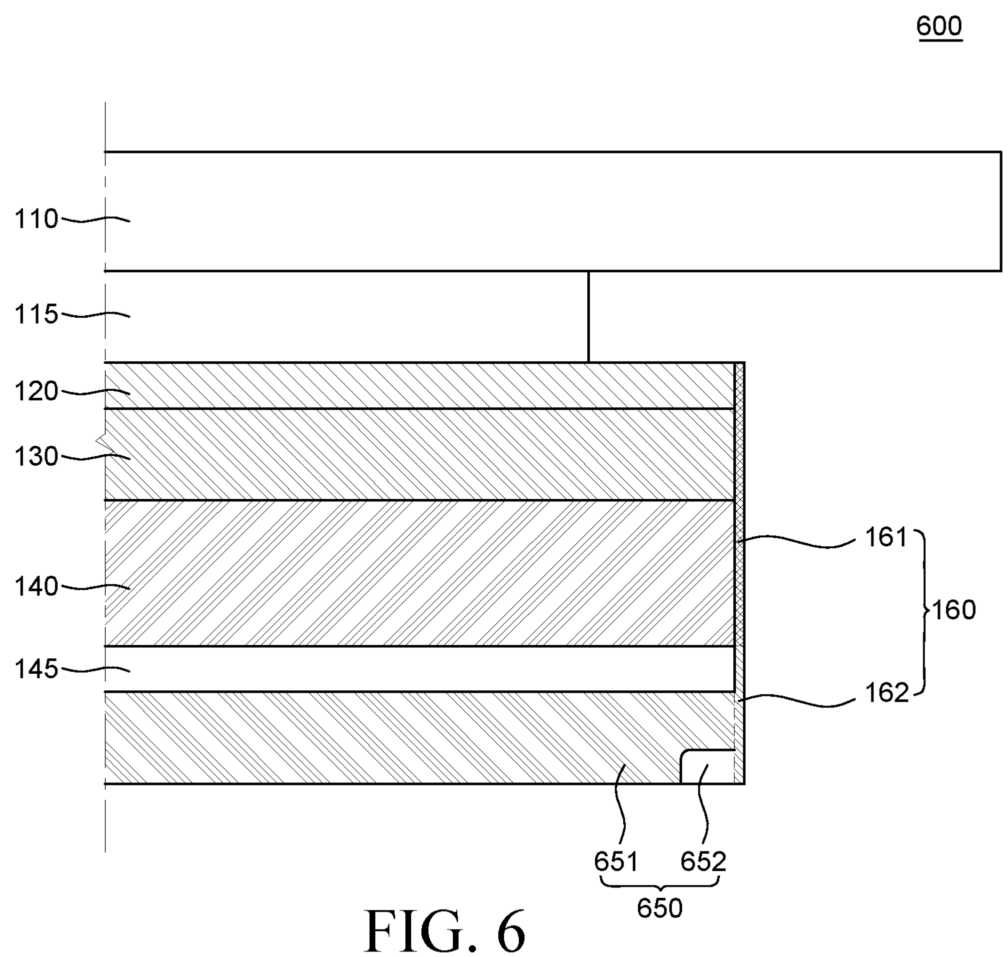
FIG. 6 is a cross-sectional view a display device according to another exemplary embodiment of the present disclosure.
Figure 7A:
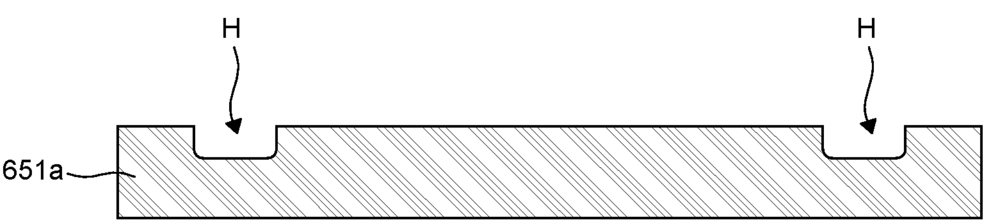
FIGS. 7A to 7D are cross-sectional views for explaining a process of fabricating the display device according to another exemplary embodiment of the present disclosure.

FIG. 6 is a cross-sectional view a display device according to another exemplary embodiment of the present disclosure. FIG. 7A through FIG. 7D are cross-sectional views for explaining a process of fabricating the display device according to another exemplary embodiment of the present disclosure. FIG. 6 is a cross-sectional view of a non-display area of the display device. A display device 600 shown in FIG. 6 through FIG. 7D is substantially the same as the display device 100 shown in FIG. 1 through FIG. 5C except a metal plate 650. Therefore, a repeated description thereof will be omitted.

Referring to FIG. 6, the display device 600 according to another exemplary embodiment of the present disclosure may include the cover window 110, the first adhesive layer 115, and the polarization member 120. Also, the display device 600 may include the display panel 130, the back plate 140, the second adhesive layer 145, the metal plate 650, and the conductive film 160.

The metal plate 650 may include a base plate 651 and a resin layer 652.

The base plate 651 may have the same size as the display panel 130. That is, a tip end of the base plate 651 may be aligned with a tip end of the display panel 130. The base plate 651 may be made of an opaque amorphous metal, for example, a nickel (Ni)-based alloy or a copper (Cu)-based alloy.

The base plate 651 may have a smaller thickness than a conventional metal plate made of stainless steel, and may have a thickness of, for example, 50 μm to 100 μm.

A groove for the resin layer 652 may be formed at a tip end of a lower surface of the base plate 651. Thus, the groove may be formed in the base plate 651 to open a part of the tip end of the lower surface of the base plate 651 and a part of a side surface of the base plate 651. The groove formed in the base plate 651 may be disposed in a trimming line overlapping region of the base plate 651.

The resin layer 652 may be disposed in the groove formed in the base plate 651. As descried above, the groove is formed in the base plate 651 to open a part of the tip end of the lower surface of the base plate 651 and a part of the side surface of the base plate 651. Therefore, the resin layer 652 may be disposed to form a tip end of a lower surface of the metal plate 650 and a part of its side surface may be in direct contact with the second conductive film 162.

The resin layer 652 may be formed by filling the groove in the base plate 651 with a resin-based material to further facilitate a trimming process. The resin-based material of the resin layer 652 may be, for example, an epoxy-based resin or an acryl-based resin, and may have a modulus of at least 2 GPa to enhance the rigidity of the metal plate 650.

The resin layer 652 is disposed in a trimming line-overlapping region. That is, the metal plate 650 according to another exemplary embodiment of the present disclosure includes the resin layer 652 disposed in the trimming line-overlapping region and made of the resin-based material. Therefore, it is possible to reduce a laser trimming process time and enhance the rigidity of the metal plate 650.

The display device 600 according to another exemplary embodiment of the present disclosure including the metal plate 650 is fabricated as follows. First, as shown in FIG. 7A, a groove H is formed in a basic base plate 651*a* made of an amorphous metal. The groove H may be formed in a region of the basic base plate 651*a* where the groove H is matched with the trimming line TL. The size of the groove H may be determined in consideration of a trimming process time and the thickness of the basic base plate 651*a*. The groove H may have a tetragonal shape with rounded corners, but is not limited thereto. The basic base plate 651*a* may have a thickness of 50 μm to 100 μm.

Figure 7B:
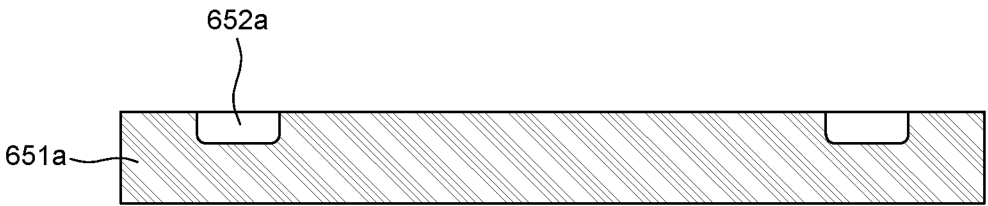

Then, referring to FIG. 7B, the groove H formed in the basic base plate 651*a* is filled with the resin-based material to form the resin layer 652*a*. The resin-based material may be an epoxy-based resin or an acryl-based resin having a modulus of 2 GPa or more.

Figure 7C:
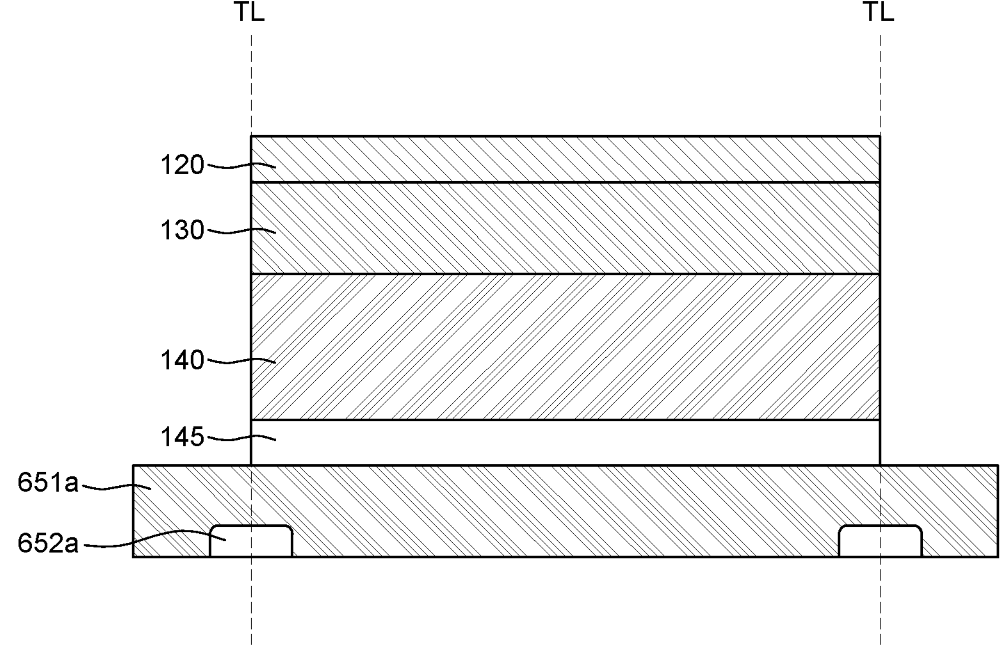
Figure 7D:
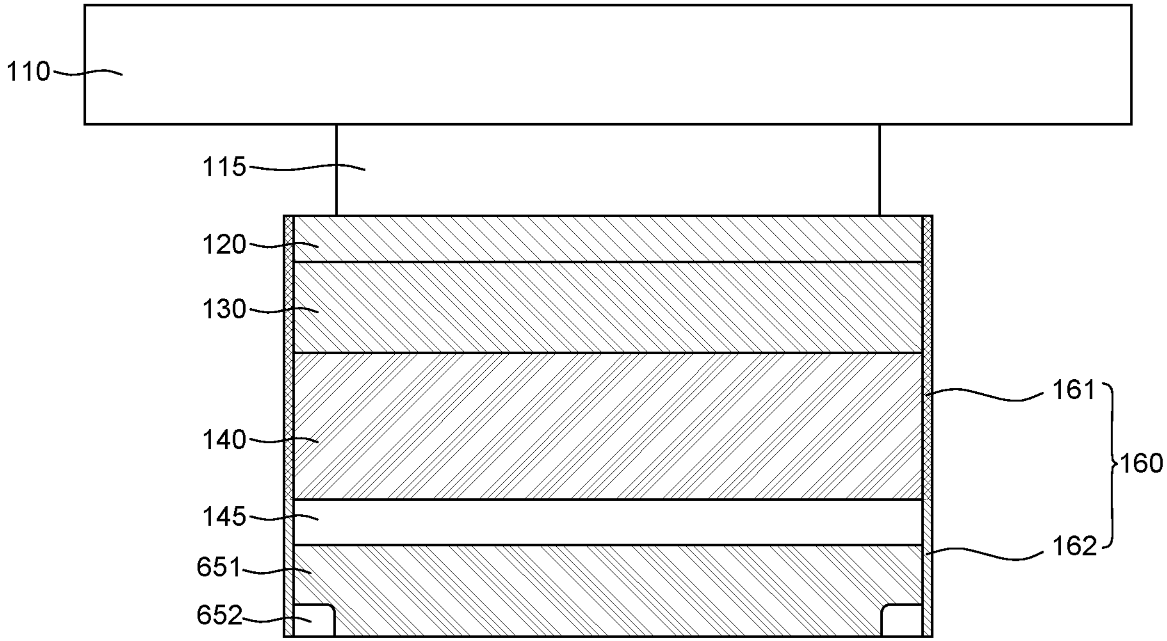

Subsequently, referring to FIG. 7C, in a state where the basic base plate 651*a* including a resin layer 652*a* as shown in FIG. 7B is upturned, the structure in which the polarization member 120, the display panel 130, and the back plate 140 are laminated is attached onto the basic base plate 651*a* by using the second adhesive layer 145. In this case, the resin layer 652*a* may be located on a lower surface of the basic base plate 651*a*.

Then, a trimming process is performed on the polarization member 120, the display panel 130, the back plate 140, the second adhesive layer 145, and the basic base plate 651*a* along the trimming line TL with a UV laser in order for the metal plate 650 and the display panel 130 to have the same size.

Thereafter, referring to FIG. 7D, when the trimming process on the polarization member 120, the display panel 130, the back plate 140, the second adhesive layer 145, and the basic metal plate 150*a* is finished, the display panel 130 and the metal plate 650 may have the same size. Also, the conductive film 160 is formed from both side surfaces of the polarization member 120 to both side surfaces of the metal plate 650. Herein, the second conductive film 162 of the conductive film 160 may be in contact with an upper side surface of the metal plate 650 composed of the base plate 651. Further, the second conductive film 162 may be in contact with a lower side surface of the metal plate 650 composed of the resin layer 652. Then, when the cover window 110 is attached onto the polarization member 120 by using the first adhesive layer 115, the display device 600 according to another exemplary embodiment of the present disclosure is completed.

As described above, in the display device 600 according to another exemplary embodiment of the present disclosure, the metal plate 650 is made of an amorphous metal and the resin layer 652 made of a resin-based material is further disposed in the trimming line-overlapping region. A trimming process may be performed more easily with the resin-based material than with the amorphous metal. Thus, it is possible to reduce a trimming process time.

In the display device 600 according to another exemplary embodiment of the present disclosure, the metal plate 650 is made of an amorphous metal and the resin layer 652 made of a resin-based material having a modulus of 2 GPa or more is further disposed in the trimming line-overlapping region. Thus, it is possible to enhance the rigidity of the metal plate 650.

In the display device 600 according to another exemplary embodiment of the present disclosure, the display panel 130 and the metal plate 650 have the same size. Also, the conductive film 160 formed during the trimming process is disposed from the side surface of the polarization member 120 to a side surface of the metal plate 650. Thus, electrostatic charges generated due to friction such as a touch are discharged through a ground path for electrostatic charges generated by the conductive film 160. Accordingly, it is possible to suppress an effect of the electrostatic charges on the display panel 130 and improve the reliability of the display device 600.

The exemplary embodiments of the present disclosure can also be described as follows:

According to an aspect of the present disclosure, there is provided a display device. The display device includes a display panel that displays an image. The display device further includes a polarization member disposed on the display panel. The display device further includes a back plate disposed under the display panel. The display device further includes a metal plate disposed under the back plate. The display device further includes an adhesive layer that attaches the back plate to the metal plate. A tip end of the metal plate is matched with a tip end of the display panel.

The display device may further include a conductive film disposed from a side surface of the polarization member to a side surface of the metal plate.

The conductive film may include: a first conductive film connected to the polarization member and disposed from the side surface of the polarization member to a side surface of the back plate; and a second conductive film connected to the metal plate and disposed from a side surface of the adhesive layer to the side surface of the metal plate.

A main material of the first conductive film may be carbon, and A main material of the second conductive film may be the same as that of the metal plate.

The metal plate may be made of an amorphous metal mainly containing one of nickel and copper.

The metal plate may include: a base plate made of an amorphous metal mainly containing one of nickel and copper; and a resin layer disposed at a tip end of a lower surface of the base plate.

The resin layer may be made of a resin-based material having a modulus of 2 GPa or more.

According to another aspect of the present disclosure, there is provided a display device. The display device includes a display panel that displays an image. The display device further includes a polarization member disposed on the display panel. The display device further includes a cover window disposed on the polarization member. The display device further includes a back plate disposed under the display panel. The display device further includes a metal plate disposed under the back plate and having the same size as the display panel. The display device further includes an adhesive layer that attaches the back plate to the metal plate. The metal plate is grounded, and an electrical path electrically connecting from a side surface of the polarization member to a side surface of the metal plate is formed.

The electrical path may be a layer in which materials of the polarization member and the metal plate is adsorbed.

The metal plate may be made of an amorphous metal mainly containing one of nickel and copper.

The display device may further include a resin layer disposed at a tip end of a lower surface of the metal plate. The resin layer may be made of an epoxy-based material or an acryl-based material having a modulus of 2 GPa or more.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:

a display panel configured to display an image;

a polarization member on the display panel;

a back plate under the display panel such that the display panel is between the back plate and the polarization member;

a metal plate under the back plate;

an adhesive layer between the back plate and the metal plate, the adhesive layer attaching the back plate to the metal plate; and a conductive film extending from a side surface of the polarization member to a side surface of the metal plate, wherein an end of the metal plate is aligned with an end of the display panel.

2. The display device according to claim 1, wherein the conductive film includes:

a first conductive film connected to the polarization member and extending from the side surface of the polarization member to a side surface of the back plate; and a second conductive film connected to the metal plate and extending from a side surface of the adhesive layer to the side surface of the metal plate.

3. The display device according to claim 2, wherein the first conductive film comprises carbon, and the second conductive film comprises a same material as the metal plate.

4. The display device according to claim 3, wherein the metal plate comprises an amorphous metal including one of nickel or copper.

5. The display device according to claim 1, wherein the metal plate comprises:

a base plate comprising an amorphous metal including one of nickel or copper; and a resin layer at an end of a lower surface of the base plate.

6. The display device according to claim 5, wherein the resin layer includes a resin-based material having a modulus of at least 2 GPa.

7. A display device, comprising:

a display panel configured to display an image;

a polarization member on the display panel;

a cover window on the polarization member;

a back plate under the display panel such that the display panel is between the back plate and the polarization member;

a metal plate under the back plate, the metal plate connected to ground, the metal plate having a size that is a same as a size of the display panel;

an adhesive layer between the back plate and the metal plate, the adhesive layer attaching the back plate to the metal plate; and an electrical path connected to the polarization member and the metal plate, the electrical path extending from a side surface of the polarization member to a side surface of the metal plate.

8. The display device according to claim 7, wherein the electrical path comprises a layer configured to adsorb materials of the polarization member and the metal plate.

9. The display device according to claim 7, wherein the metal plate comprises an amorphous metal including one of nickel or copper.

10. The display device according to claim 9, further comprising:

a resin layer at an end of a lower surface of the metal plate, the resin layer comprising an epoxy-based material or an acryl-based material having a modulus of at least 2 GPa.

11. A display device comprising:

a display panel configured to display an image;

a metal plate on the display panel, the metal plate is connected to ground and has a first end that is aligned with a first end of the display panel; and a first conductive element connected to the display panel and the metal plate, the first conductive element extending from a side surface of the first end of the display panel to a side surface of the first end of the metal plate.

12. The display device of claim 11, wherein the metal plate has a second end that is opposite the first end of the metal plate and is aligned with a second end of the display panel that is opposite the first end of the display panel.

13. The display device of claim 12, further comprising:

a second conductive element connected to the display panel and the metal plate, the second conductive element extending from a side surface of the second end of the display panel to a side surface of the second end of the metal plate.

14. The display device of claim 13, wherein each of the first conductive element and the second conductive element comprises a conductive film.

15. The display device of claim 11, wherein a portion of the first end of the metal plate comprises a groove filled with resin.

16. The display device of claim 11, further comprising:

a polarization member on a first side of the display panel, the polarization member having a first end;

a back plate on a second side of the display panel that is opposite the first side of the display panel, the back plate having a first end; and an adhesive layer between the back plate and the metal plate such that the adhesive layer attaches the back plate to the metal plate, the adhesive layer having a first end, wherein the first end of the display panel, the first end of the metal plate, the first end of the polarization member, the first end of the back plate, and the first end of the adhesive layer are aligned.

17. The display device of claim 16, wherein the first conductive element extends along a side surface of the first end of the polarization member, the side surface of the first end of the display panel, a side surface of the first end of the back plate, a side surface of the first end of the adhesive layer, and the side surface of the first end of the metal plate.

18. The display device of claim 11, wherein the first conductive element comprises:

a first conductive film on the side surface of the first end of the display panel but not on the side surface of the first end of the metal plate; and a second conductive film on the first end of the metal plate but not on the first end of the display panel, the second conductive film extending from the first conductive film and comprises a material that is different from a material of the first conductive element.

19. The display device of claim 18, wherein the material of the first conductive film comprises carbon and the material of the second conductive film comprises a same material as the metal plate.

* * * * *